United States Patent
Takeda et al.

(10) Patent No.: US 12,012,536 B2
(45) Date of Patent: *Jun. 18, 2024

(54) β-SiAlON PHOSPHOR AND LIGHT-EMITTING APPARATUS

(71) Applicant: DENKA COMPANY LIMITED, Tokyo (JP)

(72) Inventors: Yusuke Takeda, Omuta (JP); Tomohiro Nomiyama, Omuta (JP); Manabu Kobayashi, Omuta (JP); Shintaro Watanabe, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 889 days.

This patent is subject to a terminal disclaimer.

(21) Appl. No.: 16/981,819

(22) PCT Filed: Mar. 19, 2019

(86) PCT No.: PCT/JP2019/011620
§ 371 (c)(1),
(2) Date: Sep. 17, 2020

(87) PCT Pub. No.: WO2019/188631
PCT Pub. Date: Oct. 3, 2019

(65) Prior Publication Data
US 2021/0032535 A1 Feb. 4, 2021

(30) Foreign Application Priority Data

Mar. 29, 2018 (JP) ................. 2018-064666

(51) Int. Cl.
| | | |
|---|---|---|
| C09K 11/64 | (2006.01) | |
| C09K 11/08 | (2006.01) | |
| C09K 11/77 | (2006.01) | |
| H01L 33/50 | (2010.01) | |

(52) U.S. Cl.
CPC ........ C09K 11/646 (2013.01); C09K 11/0883 (2013.01); C09K 11/77066 (2021.01); C09K 11/77348 (2021.01); H01L 33/502 (2013.01); *C01P 2002/30* (2013.01); *C01P 2004/51* (2013.01); *C01P 2004/90* (2013.01); *C01P 2006/11* (2013.01)

(58) Field of Classification Search
CPC ........ C09K 11/77348; C09K 11/77066; C09K 11/646; C01P 2002/30; C01P 2004/51; C01P 2004/90; C01P 2006/11
See application file for complete search history.

(56) References Cited

U.S. PATENT DOCUMENTS

| | | | |
|---|---|---|---|
| 11,702,592 B2 * | 7/2023 | Kobayashi | H01L 33/502 |
| | | | 252/301.4 F |
| 2004/0155225 A1 | 8/2004 | Yamada et al. | |
| 2007/0108896 A1 | 5/2007 | Hirosaki | |
| 2011/0121234 A1 | 5/2011 | Hirosaki | |
| 2011/0305005 A1 | 12/2011 | Tsukatani et al. | |
| 2012/0026426 A1 | 2/2012 | Hanamoto et al. | |
| 2012/0228551 A1 | 9/2012 | Emoto et al. | |
| 2012/0313507 A1 | 12/2012 | Hashimoto et al. | |
| 2015/0035430 A1 | 2/2015 | Yoshida et al. | |
| 2016/0181484 A1 | 6/2016 | Roh et al. | |
| 2016/0347999 A1 | 12/2016 | Morikawa et al. | |
| 2017/0166810 A1 | 6/2017 | Morikawa et al. | |
| 2017/0342321 A1 * | 11/2017 | Aoyagi | C09K 11/77348 |
| 2019/0062631 A1 * | 2/2019 | Kobayashi | C09K 11/616 |
| 2020/0095501 A1 | 3/2020 | Ichikawa et al. | |

FOREIGN PATENT DOCUMENTS

| | | |
|---|---|---|
| CN | 102639672 A | 8/2012 |
| CN | 103080270 A | 5/2013 |
| EP | 3252127 A1 | 12/2017 |
| JP | H08-339761 A | 12/1996 |
| JP | 2004-238505 A | 8/2004 |
| JP | 2005-255895 A | 9/2005 |
| JP | 2006-269938 A | 10/2006 |
| JP | 2007-335495 A | 12/2007 |
| JP | 2013-028814 A | 2/2013 |
| JP | 2013-127076 A | 6/2013 |
| JP | 2016-191057 A | 11/2016 |
| JP | 2016-222898 A | 12/2016 |
| JP | 2017-110206 A | 6/2017 |
| JP | 2017-214551 A | 12/2017 |
| JP | 6273394 B1 | 1/2018 |
| KR | 10-2011-0122765 A | 11/2011 |
| KR | 10-2016-0077331 A | 7/2016 |

(Continued)

OTHER PUBLICATIONS

Jun. 7, 2022 Office Action issued in Taiwanese Patent Application No. 108110427.

(Continued)

*Primary Examiner* — C Melissa Koslow

(74) *Attorney, Agent, or Firm* — Oliff PLC

(57) ABSTRACT

A β-sialon phosphor represented by general formula: $Si_{6-z}Al_zO_zN_{8-z}$ (0<z<4.2) has as a host crystal, a crystal structure identical to that of a β-sialon crystal phase and having a bulk density of 0.80 g/cm³ or more and 1.60 g/cm³ or less. Also, a light-emitting element includes the β-sialon phosphor and a semiconductor light-emitting element capable of exciting the β-sialon phosphor.

7 Claims, No Drawings

(56) References Cited

FOREIGN PATENT DOCUMENTS

| KR | 10-2017-0135716 A | 12/2017 |
| WO | 2010/116953 A1 | 10/2010 |
| WO | 2012/046288 A1 | 4/2012 |
| WO | 2017/122800 A1 | 7/2017 |
| WO | WO 2017/122800 * | 7/2017 |

OTHER PUBLICATIONS

Aug. 8, 2022 Office Action Issued in Chinese Patent Application No. 201980022458.8.
May 7, 2019 International Search Report issued in International Patent Application No. PCT/JP2019/011620.
Sep. 29, 2020 International Preliminary Report on Patentability issued in International Patent Application No. PCT/JP2019/011620.
Oct. 27, 2023 Office Action issued in Korean Patent Application No. 10-2020-7030895.
Apr. 9, 2024 Notice of Allowance issued in Korean Patent Application No. 10-2020-7030895.

* cited by examiner

β-SiAlON PHOSPHOR AND LIGHT-EMITTING APPARATUS

TECHNICAL FIELD

The invention relates to a β-sialon (SiAlON) phosphor that is excited by light of a wavelength of ultraviolet light to blue light to thereby emit green light, and a light-emitting apparatus utilizing the phosphor.

BACKGROUND ART

White LEDs are devices that emit pseudo-white light by combinations of semiconductor light-emitting elements and phosphors, and combinations of blue LEDs and YAG yellow phosphors are known as typical examples. Image display apparatuses such as liquid crystal backlights, however, have the problem of inferior color reproducibility. White LEDs are developed where green phosphors and red phosphors are used in combination instead of yellow phosphors.

A β-sialon phosphor is known as a phosphor that emits green light (Patent Literature 1). β-Sialon, when contains europium ($Eu^{2+}$) in a crystal structure thereof, is excited by ultraviolet to blue light and serves as a phosphor that exhibits green light emission at 520 to 550 nm, and can be used as a green light-emitting component of a light-emitting apparatus such as a white LED. Such a β-sialon phosphor including a solid solution of $Eu^{2+}$, among phosphors each including a solid solution of $Eu^{2+}$, exhibits a very sharp emission spectrum and thus is a phosphor suitable for a backlight source of an image processing display apparatus or a liquid crystal display panel, in which blue, green and red narrow-band light emission is demanded.

There are also known a production method including reducing the content of oxygen for an increase in brightness of a β-sialon phosphor (Patent Literature 2) and a procedure including controlling the content of oxygen in a raw material to result in an increase in brightness (Patent Literature 3).

CITATION LIST

Patent Literature

Patent Literature 1: Japanese Patent Laid-Open No. 2005-255895
Patent Literature 2: Japanese Patent Laid-Open No. 2013-028814
Patent Literature 3: Japanese Patent Laid-Open No. 2016-222898

SUMMARY OF INVENTION

Technical Problem

Light-emitting apparatuses such as backlight and illumination for liquid crystal displays are always demanded to be improved in light-emitting characteristics, thus each member thereof is required to be enhanced in characteristics, and phosphors for use in LEDs are also demanded to be improved in light-emitting characteristics. There is also a demand for an improvement in yield of LED products by not only improvements in light-emitting characteristics by themselves, but also, for example, an improvement in production accuracy so that variations in light-emitting characteristics of white LEDs for individual products are reduced.

Solution to Problem

An object of the invention is to provide a β-sialon phosphor which can allow a light-emitting element, for example, a white LED to be more stably produced and which can allow the variation among LED products particularly with respect to chromaticity (herein, also simply referred to as "variation in chromaticity") to be suppressed. The present inventors have made intensive studies for solving the above problems, and as a result, have found that a light-emitting element, for example, a white LED, more suppressed in variation in chromaticity, can be produced by controlling the bulk density of a β-sialon phosphor in a specified range.

That is, embodiments of the present invention can provide the following aspects.

(1) A β-sialon phosphor represented by general formula: $Si_{6-z}Al_zO_zN_{8-z}$ (0<z<4.2), the phosphor having, as a host crystal, a crystal structure identical to that of a β-sialon crystal phase and having a bulk density of 0.80 $g/cm^3$ or more and 1.60 $g/cm^3$ or less.

(2) The β-sialon phosphor according to (1), including $Eu^{2+}$ as a light emission center element.

(3) The β-sialon phosphor according to (1) or (2), having an angle of repose of 60° or less.

(4) The β-sialon phosphor according to any one of (1) to (3), having an angle of repose of 30° or more.

(5) The β-sialon phosphor according to any one of (1) to (4), having an angle of repose of 50° or less.

(6) A light-emitting element including the β-sialon phosphor according to any one of (1) to (5) and a semiconductor light-emitting element capable of exciting the β-sialon phosphor.

(7) A light-emitting apparatus including the light-emitting element according to (6).

Advantageous Effects of Invention

A β-sialon phosphor which can be provided according to an embodiment of the invention, having a bulk density in a specified range, can be combined with a semiconductor light-emitting element capable of exciting the β-sialon phosphor, thereby forming a light-emitting element, and can allow, for example, a light-emitting element suppressed in variations in light-emitting characteristics typified by chromaticity of a white LED and more stabilized in light-emitting characteristics to be provided. Furthermore, an embodiment of the invention can provide a light-emitting apparatus including the light-emitting element and an instrument receiving the light-emitting element. Examples of the light-emitting apparatus include an illumination apparatus, a backlight apparatus, an image display apparatus and a signal apparatus.

DESCRIPTION OF EMBODIMENT

Hereinafter, modes for carrying out the invention will be described in detail. Any numerical value range herein includes the upper limit value and the lower limit value thereof, unless particularly noted.

A β-sialon phosphor according to an embodiment of the invention is a β-sialon phosphor represented by general formula: $Si_{6-z}Al_zO_zN_{8-z}$ (0<z<4.2), the phosphor having, as a host crystal, a crystal structure identical to that of a β-sialon crystal phase and having a bulk density of 0.80 $g/cm^3$ or more and 1.60 $g/cm^3$ or less. The β-sialon phosphor is a solid solution of β-silicon nitride, corresponding to a solid solution where the position of Si and the position of N in a β-silicon nitride crystal are replaced with Al and O, respectively. Since there are two formula weight atoms in a unit cell (unit lattice), $Si_{6-z}Al_zO_zN_{8-z}$ is used as the general formula. The composition z is here more than 0 and less than 4.2, and the range of the solid solution is very wide. The molar ratio of (Si, Al)/(N, O) is required to maintain 3/4. The crystal structure of β-silicon nitride is defined as the structure having a symmetry of P6₃ or P6₃/m and having an ideal atom position.

The method for producing the β-sialon phosphor generally involves adding, as raw materials, not only silicon nitride, but also silicon oxide and aluminum nitride, or aluminum oxide, aluminum nitride and europium oxide, and heating the resultant, and thus the β-sialon phosphor is obtained. The crystal structure of the phosphor can be confirmed by powder X-ray diffraction. The crystal phase present in the phosphor is preferably a β-sialon single phase, and may include any phase different from that of β-sialon as long as such any phase has no large influence on light-emitting characteristics and reliability.

The β-sialon phosphor is extremely useful as, for example, a phosphor for LED, and can be used for, for example, any LED that absorbs excitation light of a wavelength in the range from 420 to 480 nm and emits light of a wavelength of more than 480 nm and 800 nm or less.

The β-sialon phosphor of the invention has a bulk density of 0.80 g/cm³ or more and 1.60 g/cm³ or less. A bulk density of less than 0.80 g/cm³ or more than 1.60 g/cm³ causes an increase in variation in chromaticity of any LED made by use of the phosphor.

In general, the bulk density of a powder can be determined according to a method involving measuring the volume of a known weight of a powder sample loaded in a measuring cylinder (method 1), a method involving measuring the mass of a known volume of a powder sample loaded in a container, through a volumeter (method 2), or a method of measurement by use of a dedicated container for measurement (method 3). Hereinafter, the method 3 will be described in detail. First, a sample is provided in an amount sufficient for measurement. A dry cylindrical container for measurement, having a constant volume, is equipped with an auxiliary cylinder, and a required amount of the sample is loaded therein. Such a container for measurement, equipped with an auxiliary cylinder, is tapped several times at 50 to 60 times/min. The auxiliary cylinder is removed, an excess powder is scraped off from the upper surface of the container, and the weight is measured. The mass of an empty cylindrical container, measured in advance, is subtracted, and thus the mass of the resulting powder is measured. The weight per unit volume of the sample is calculated, and thus the bulk density is determined. The bulk density is preferably repeatedly measured, more preferably measured multiple times and determined as the average value of such measurement values.

The bulk density of a powder can be generally controlled by the grain size, the grain size distribution, and the surface state of the powder.

A β-sialon phosphor provided by an embodiment of the invention preferably has a mass median size (D50) of 30 μm or less, as measured according to a laser diffraction scattering method. A mass median size of 30 μm or less can allow the bulk density to fall within a specified range and can reduce the variation in chromaticity of a LED made by use of the phosphor. A mass median size of 5 μm or more is also preferable because light-emitting characteristics of the phosphor are enhanced. The mass median size is here the value obtained by conversion and calculation from the volume median size obtained from the cumulative distribution curve measured by a laser diffraction scattering method according to JIS R1622:1995 and JIS R1629:1997.

A β-sialon phosphor according to an embodiment of the invention further preferably has a span value of 1.7 or less, further preferably 0.1 or more and 1.6 or less. The span value here means the value calculated by (D90−D10)/D50, and the D10 and D90 here mean 10% size and 90% size, respectively, obtained from the cumulative distribution curve on a mass basis, measured in the same manner as in the above mass median size. The span value serves as an index representing the distribution width of the grain size distribution, namely, the variation in size of a grain of the β-sialon phosphor. A smaller span value allows the bulk density to more easily fall within a specified range and can reduce the variation in chromaticity of a LED made by use of the phosphor.

The surface state of a powder can be changed depending on a post-treatment method in production. Examples of the post-treatment method of the β-sialon phosphor include washing, and covering of the surface of a phosphor grain, and washing is preferable from the viewpoint of enhancements in productivity and bulk density. The washing method is not particularly limited, and the phosphor is preferably washed with an aqueous acidic, alkaline, or polar solution, and may be washed with one aqueous washing solution or may be washed with two or more aqueous washing solutions multiple times.

A β-sialon phosphor according to an embodiment of the invention preferably has an angle of repose of 60° or less, more preferably 50° or less. The angle of repose is preferably 30° or more. The angle of repose represents the fluidity of the phosphor, and thus serves as an index representing the degree of dispersion of the phosphor used in a LED. An angle of repose of 30° or more and 60° or less can reduce the variation in chromaticity of a LED produced.

Examples of the method for measuring the angle of repose include a method (injection method) involving measuring the angle created by a powder in free fall of a sample loaded in a container and deposition thereof on a horizontal surface, a method (discharge method) involving allowing a sample to free fall through a small hole in a container bottom and measuring the angle created by a powder remaining the container, and a method (gradient method) involving loading a powder in a container, inclining the container and measuring the angle created by the powder. In particular, the injection method is desirably used. Hereinafter, the injection method will be described in detail. A sample is allowed to fall from a funnel at a certain height, onto a horizontal substrate, a low angle is calculated from the diameter and the height of a conical deposited article produced, and the low angle is defined as the angle of repose. The angle of repose is preferably repeatedly measured, more preferably measured multiple times and determined as the average value of such measurement values.

Method for Producing β-sialon Phosphor

The method for producing the β-sialon phosphor is not particularly limited. A method is here exemplified which involves firing a raw material-mixed powder capable of forming a compound represented by the general formula, in a determined temperature range in a nitrogen atmosphere.

In the production method, any nitride and oxide of each constituent element, namely, silicon nitride, aluminum nitride, europium nitride, silicon oxide, aluminum oxide, and europium oxide are suitably used as raw materials.

The method for mixing the above-mentioned raw materials is not particularly limited, and europium nitride which reacts violently with moisture and oxygen in the air is suitably handled in a glove box in which the atmosphere is replaced with an inert atmosphere.

A firing container is filled with the above-mentioned raw material-mixed powder. The firing container is preferably formed from any material which is stable in a nitrogen atmosphere at a high temperature and which hardly reacts with the raw material-mixed powder and a reaction product thereof, and examples thereof include a container made of boron nitride, a container made of a high melting point metal, and a container made of carbon.

The firing container filled with the raw material-mixed powder is installed in a firing furnace, and the powder is fired at 1800° C. or more and 2100° C. or less in a nitrogen atmosphere. While a high heating temperature enables $Eu^{2+}$ to enter a β-sialon crystal, thereby providing β-sialon having a sufficient intensity of light emission, a too low firing temperature causes an increase in amount of remaining of an unreacted substance.

The firing time is selected in such a way as to fall within a time range which does not cause any failure, for example, the presence of a large amount of an unreacted substance, insufficient grain growth, or deterioration in productivity, and is preferably 2 hours or more and 24 hours or less.

The pressure of the firing atmosphere is selected depending on the firing temperature. While the β-sialon phosphor of the invention can be stably present at the atmospheric pressure at a temperature of up to about 1800° C., a pressurized atmosphere is required at a temperature equal to or more than that temperature in order to suppress degradation of the phosphor. The higher the atmosphere pressure is, the higher the degradation temperature of the phosphor is, and the pressure is preferably less than 1 MPa in consideration of industrial productivity.

The state of a fired product is varied and is in the form of a powdery, clumped, or sintered body depending on compounding of the raw materials and the firing conditions. In the case of use as a phosphor, the fired product is formed into a powder having a determined size, by combining crushing, pulverizing and/or classification operation(s).

A heat treatment step may be provided after a pulverizing step in the method for producing the β-sialon phosphor of the invention. The heat treatment step can be included, thereby providing a β-sialon phosphor higher in efficiency of light emission. The heat treatment temperature in the heat treatment step is preferably 1400° C. or more and 2100° C. or less. The atmosphere of the heat treatment step is preferably a nitrogen atmosphere, a reducing atmosphere, or a noble atmosphere. The atmosphere pressure is preferably less than 1 MPa in consideration of industrial productivity.

A washing step is preferably provided after a pulverizing step in a method for producing a β-sialon phosphor according to an embodiment of the invention. The aqueous solution for use in the washing step is preferably an aqueous acidic, alkaline, or polar solution, as described above. The washing step is a step of dispersing the β-sialon phosphor in the above-mentioned aqueous solution and stirring the resultant for several minutes to several hours. The washing step can dissolve and remove any impurity element derived from the firing container, a different phase generated in the firing step, any impurity element included in the raw materials, and any impurity element incorporated in the pulverizing step, and can clean the surface of the phosphor, resulting in an enhancement in bulk density of the resulting phosphor powder.

The β-sialon phosphor can be combined with a semiconductor light-emitting element capable of exciting the phosphor, thereby forming a light-emitting element, and furthermore also providing a light-emitting apparatus including the light-emitting element. A phosphor obtained by combining and mixing a β-sialon phosphor that emits green light, according to an embodiment of the invention, and, if necessary, furthermore a yellow phosphor, a red phosphor, and/or a blue phosphor can be irradiated particularly with ultraviolet light or visible light of a wavelength of 350 nm or more and 500 nm or less, from the semiconductor light-emitting element, thereby providing a white light-emitting element (white LED).

EXAMPLES

Examples of the invention will be described in detail with reference to Table 1. Table 1 shows the D10, D50, D90, span value, bulk density, and angle of repose of each phosphor of Examples and Comparative Examples.

TABLE 1

| | Grain size distribution(μm) | | | Span value | Bulk density (g/cm³) | Angle of repose |
|---|---|---|---|---|---|---|
| | D10 | D50 | D90 | | | |
| Example 1 | 10.5 | 16.5 | 26.3 | 0.96 | 1.13 | 43° |
| Example 2 | 10.8 | 20.0 | 38.1 | 1.37 | 0.92 | 42° |
| Example 3 | 12.2 | 24.9 | 49.5 | 1.50 | 1.16 | 38° |
| Example 4 | 7.2 | 12.1 | 20.6 | 1.11 | 0.99 | 47° |
| Example 5 | 6.3 | 11.9 | 21.0 | 1.24 | 0.91 | 41° |
| Comparative Example 1 | 16.5 | 49.6 | 114.0 | 1.97 | 1.71 | 62° |
| Comparative Example 2 | 6.2 | 11.7 | 21.2 | 1.28 | 0.75 | 52° |

Example 1

A V-type mixing machine was used to mix 98.06% by weight of an α-silicon nitride powder (SN-E10 grade, manufactured by Ube Industries, Ltd.), 1.34% by weight of an aluminum nitride powder (E grade, manufactured by Tokuyama Corporation), and 0.60% by weight of europium oxide (RU grade, manufactured by Shin-Etsu Chemical Co., Ltd.). The mixture was allowed to fully pass through a sieve having an aperture of 250 μm for removal of aggregation, thereby providing a raw material-mixed powder.

A cylindrical container equipped with a lid and made of boron nitride (N-1 grade manufactured by Denka Company Limited) was filled with 250 g of the raw material-mixed powder which passed through the sieve, and a heating treatment at 2000° C. for 15 hours was performed in a pressurized nitrogen atmosphere at 0.8 MPa in an electric furnace of a carbon heater.

After cooling, a sample recovered from the furnace was a green clumped product, and was crushed in a mortar and finally allowed to fully pass through a sieve having an aperture of 150 μm.

The resulting phosphor sample was subjected to powder X-ray diffraction using CuKα-ray by use of an X-ray diffraction apparatus (UltimaIV manufactured by Rigaku Corporation). The same diffraction pattern as that of a β-sialon crystal phase was observed in the resulting X-ray diffraction pattern.

A cylindrical container made of boron nitride was filled with such a powder which passed through the sieve, and the powder was retained at 1500° C. in an argon flow atmosphere at the atmospheric pressure in an electric furnace of a carbon heater for 8 hours, thereby providing a β-sialon powder heat-treated.

The resulting β-sialon powder heat-treated was immersed in a mixed acid of hydrofluoric acid and nitric acid. Thereafter, decantation for removal of any supernatant and fine powder was repeated until a neutral solution was obtained, and a precipitate finally obtained was filtered and dried, and furthermore allowed to pass through a sieve having an aperture of 150 µm, thereby providing a β-sialon phosphor of Example 1.

Method for Measuring Mass Median Size and Span Value

The mass median size and the pan value were obtained by calculating D10, D50 (mass median size), and D90 from the volume average size measured by a laser diffraction scattering method according to JIS R1622:1995 and R1629:1997 by use of a grain size distribution measurement apparatus (Microtrac MT3000II manufactured by MicrotracBEL Corp.), and determining the span value ((D90−D10)/D50).

Method for Measuring Bulk Density

The bulk density was measured according to the following method. A cylindrical container as a constant-volume container (25 cc) was used for a container for measurement, and the mass thereof was measured by a scale. The container for measurement was equipped with an auxiliary cylinder, a sample was loaded until overflow, such a container for measurement, equipped with an auxiliary cylinder, was tapped fifty times at 50 to 60 times/minute, and the auxiliary cylinder was removed. The sample put over the upper end portion of the container for measurement was leveled off by using a leveling plate. The leveling plate was here used with being inclined backward from the direction of leveling off so that no powder was compressed. The mass of the resultant together with the container for measurement was measured by a scale, the mass of the container for measurement was subtracted therefrom, and the mass of the sample was thus calculated. The measurement was performed three times. The average value with respect to the value obtained by dividing the mass of the sample, as calculated in such each measurement, by the volume of the container for measurement was calculated as the bulk density.

Method for Measuring Angle of Repose

The angle of repose was measured according to the following method. The low angle was calculated from the diameter and the height of a conical deposited product produced by allowing 20 g of a sample to fall onto a substrate from a height of 2 to 4 cm, corresponding to the height of the upper edge of a commercially available glass funnel where the inner diameter of a nozzle was 10 mm, through the funnel at a rate per minute of 20 to 60 g. The measurement was performed three times, and the average value with respect to the low angle was defined as the angle of repose.

Examples 2 to 4 and Comparative Example 1

Each phosphor powder of Examples 2 to 4 and Comparative Example 1 was produced under the same conditions as in Example 1 except that the pulverization and classification conditions were changed such that D10, D50 (mass median size), and D90 were as shown in Table 1. Characteristics of each of the phosphors obtained in Examples 2 to 4 and Comparative Example 1, together with those in Example 1, are shown in Table 1.

Example 5

A phosphor powder of Example 5 was produced under the same conditions as in Example 1 except that the pulverization and classification conditions were changed such that D10, D50 (mass median size), and D90 were as shown in Table 1 and washing with an aqueous ethanol solution was added after the acid washing. Characteristics of the phosphor obtained in Example 5 are also collectively shown in Table 1.

Comparative Example 2

A phosphor powder of Comparative Example 2 was produced under the same conditions as in Example 5 except that no washing with an aqueous ethanol solution was performed after the acid washing. Characteristics of the phosphor obtained in Comparative Example 2, together with those in Examples 1 to 5 and Comparative Example 1, are shown in Table 1.

Production of LED

Example 6

A LED was produced by using a grain of the β-sialon phosphor obtained in Example 1. In other words, 10% by mass of the phosphor grain was added to a silicone resin (trade name: KER6150 manufactured by Shin-Etsu Chemical Co., Ltd.) having thermosetting properties and having fluidity at ordinary temperature, and stirred and mixed to prepare a slurry. Next, 6 mg of the slurry was injected to a top view type package where a blue LED chip having a peak at a wavelength of 450 to 460 nm was mounted, and thereafter the slurry was heated and cured at a temperature of 150° C. for 2 hours. Thus, a LED was produced which included the β-sialon phosphor grain of Example 1 and which could absorb light of a wavelength in the range of 420 to 480 nm and emit light of a wavelength in the range of more than 480 nm and 800 nm or less.

Example 7

A LED was produced under the same conditions as in Example 6 except that the β-sialon phosphor grain obtained in Example 2 was used.

Example 8

A LED was produced under the same conditions as in Example 6 except that the β-sialon phosphor grain obtained in Example 3 was used.

Example 9

A LED was produced under the same conditions as in Example 6 except that the β-sialon phosphor grain obtained in Example 4 was used.

Example 10

A LED was produced under the same conditions as in Example 6 except that the β-sialon phosphor grain obtained in Example 5 was used.

Comparative Example 3

A LED was produced under the same conditions as in Example 6 except that the β-sialon phosphor grain obtained in Comparative Example 1 was used.

Comparative Example 4

A LED was produced under the same conditions as in Example 6 except that the β-sialon phosphor grain obtained in Comparative Example 2 was used.

Evaluation of Light-Emitting Characteristics of LED

Fifty LEDs were produced with respect to each of those produced in Examples 6 to 10 and Comparative Examples 3 to 4, and subjected to measurement for chromaticity evaluation by use of a LED measurement apparatus (trade name: CAS140B manufactured by Instrument System). The results were summarized in Table 2 shown below. The chromaticity evaluation here indicated the respective standard deviations σ of the x value and the y value of the XYZ color system as one of the CIE chromaticity coordinates.

TABLE 2

| Phosphor used | | Standard deviation σ (Chromaticity x) | Standard deviation σ (Chromaticity y) |
| --- | --- | --- | --- |
| Example 6 | Example 1 | 0.002 | 0.003 |
| Example 7 | Example 2 | 0.003 | 0.004 |
| Example 8 | Example 3 | 0.005 | 0.006 |
| Example 9 | Example 4 | 0.003 | 0.004 |
| Example 10 | Example 5 | 0.004 | 0.005 |
| Comparative Example 3 | Comparative Example 1 | 0.013 | 0.015 |
| Comparative Example 4 | Comparative Example 2 | 0.010 | 0.011 |

It was found from the results of Examples and Comparative Examples, shown in Table 2, that the bulk density of the β-sialon phosphor was controlled in the specified range to thereby allow a LED using the phosphor to be small in variation in chromaticity.

INDUSTRIAL APPLICABILITY

The β-sialon phosphor of the invention is excited by blue light to thereby exhibit green light emission, providing a LED smaller in variation in chromaticity than conventional one. That is, the β-sialon phosphor of the invention can be suitably used as one white phosphor for LED, which is formed by combining the phosphor with a light-emitting element using the phosphor, for example, a semiconductor light-emitting element capable of exciting for emission of blue light, and the light-emitting element can be suitably used for a light-emitting apparatus such as an illumination instrument or an image display apparatus.

The invention claimed is:

1. A β-sialon phosphor represented by general formula:

wherein $0<z<4.2$,
the phosphor having, as a host crystal, a crystal structure identical to that of a β-sialon crystal phase, having a bulk density of 0.80 g/cm³ or more and 1.60 g/cm³ or less, and having a span value of 0.96 or less,
wherein the span value of the phosphor is calculated by the formula:

$$(D90-D10)/(D50)$$

in which D50 is a mass median size, and D10 and D90 are mean 10% and 90% sizes, respectively, obtained from a cumulative distribution curve measured by a laser diffraction scattering method according to JIS R1622:1995 and JIS R1629:1997.

2. The β-sialon phosphor according to claim 1, comprising $Eu^{2+}$ as a light emission center element.

3. The β-sialon phosphor according to claim 1, having an angle of repose of 60° or less.

4. The β-sialon phosphor according to claim 1, having an angle of repose of from 30° or more to 60° or less.

5. The β-sialon phosphor according to claim 1, having an angle of repose of 50° or less.

6. A light-emitting element comprising the β-sialon phosphor according to claim 1 and a semiconductor light-emitting element capable of exciting the β-sialon phosphor.

7. A light-emitting apparatus comprising the light-emitting element according to claim 6.

* * * * *